United States Patent [19]
Kieser et al.

[11] Patent Number: 5,844,331
[45] Date of Patent: Dec. 1, 1998

[54] PROCESS FOR MONITORING THE WEAR OF AT LEAST ONE CONTACT IN A SWITCHING DEVICE AND SWITCHING DEVICE DESIGNED THEREOF

[75] Inventors: Jörg Kieser, Forcheim; David-Walter Branston, Effeltrich; Reinhard Maier, Herzogenaurach; Erich Voss, Fichtenhof, all of Germany

[73] Assignee: Siemens Aktiengesellschaft, München, Germany

[21] Appl. No.: 817,988

[22] PCT Filed: Oct. 25, 1995

[86] PCT No.: PCT/DE95/01483

§ 371 Date: May 9, 1996

§ 102(e) Date: May 9, 1996

[87] PCT Pub. No.: WO96/13732

PCT Pub. Date: May 9, 1996

[30] Foreign Application Priority Data

Oct. 27, 1994 [DE] Germany ............ 44 38 475.0

[51] Int. Cl.[6] .................................. H02H 3/26
[52] U.S. Cl. ............ 307/137; 73/86; 324/71.2; 324/421; 324/700; 361/5; 361/6
[58] Field of Search .................... 307/137, 134; 73/86; 324/700, 71.2, 415, 421; 340/650, 635; 361/5, 6; 218/48

[56] References Cited

U.S. PATENT DOCUMENTS 5,250,909  10/1993  Bitts ........................... 340/650
5,420,571   5/1995  Coleman et al. ............. 340/635
5,453,591   9/1995  Stroud ........................... 218/48
5,488,530   1/1996  De Jong ........................... 361/6
5,747,984   5/1998  Amft et al. ..................... 324/71

FOREIGN PATENT DOCUMENTS

| 656271 | 11/1935 | Germany . |
| 1 174 877 | 7/1964 | Germany . |
| 73 20 355 | 12/1976 | Germany . |
| 27 28 355 | 12/1977 | Germany . |
| 33 37 553 | 4/1984 | Germany . |
| 37 14 802 | 11/1988 | Germany . |
| 40 28 721 | 3/1992 | Germany . |
| 3-295116A | 12/1991 | Japan . |
| WO 94/22153 | 9/1994 | WIPO . |

*Primary Examiner*—Albert W. Paladini
*Attorney, Agent, or Firm*—Kenyon & Kenyon

[57] ABSTRACT

A switching device including a measuring means for monitoring contact erosion, which is provided between a contact element and an associated contact support. The switching device includes an electrically insulated signal line, which is usable in individual and/or multiple contacts, is used as the measuring means, the signal line being integrated into a single monitoring circuit. In the switching device, there is arranged, between at least one of the contact elements and the associated contact support or in the contact material, an electrical conductor with insulator as the signal line, damage to or destruction of the insulator and/or the conductor being utilized to generate an external signal as an indication of the end of the service life of the contact element.

12 Claims, 3 Drawing Sheets

PROCESS FOR MONITORING THE WEAR OF AT LEAST ONE CONTACT IN A SWITCHING DEVICE AND SWITCHING DEVICE DESIGNED THEREOF

FIELD OF THE INVENTION

The present invention relates to a switching device, in particular a contactor or circuit breaker, having contact elements that are mounted in a switching device housing on contact supports, and having an electrically insulated signal line as means for monitoring contact erosion, damage to or destruction of the insulator and/or the conductor being utilized to generate an external signal as an indication of the end of the service life of at least one of the contact elements.

BACKGROUND INFORMATION

The service life of switching contact elements is determined by erosion, i.e. by the gradual loss of contact material under the influence of the arc which occurs in the switching operation. Erosion will generally wear away the contact elements in non-uniform fashion. The service life ends when the contact material has either completely eroded away or has been removed to a defined minimum thickness at least at one point in the contact region.

At present, the state of the switch contact elements can be assessed in practice only by opening the switching device and by visual inspection. This is particularly true for the remaining expected service life, a knowledge of which is of central importance for the functionality of the switching device and thus for the operating reliability of the load unit being switched.

DE-OS 40 28 721 discloses a method for determining the remaining service life of switching devices, in which the charge that has flowed during a switching operation is electronically determined and summed for the switching operations. This method is in principle suitable not only for indicating a defined remaining service life, but moreover also for indicating the erosion state of the contact elements at any desired point in time. A comparatively large outlay for the associated electronics is necessary, however, so that profitability may exist only for large switching devices.

In addition, an earlier international patent application (PCT/DE 94/00244) that was not pre-published describes a switching device in which the contact elements are slotted on the rear side and installed on a split contact support. The remaining service life of the contact can be determined with this arrangement: when erosion has eroded away the material located over the slot, two contact halves are created. When switching takes place in this condition, a potential difference occurs between the two contact halves; this is measured as a voltage, and can be used as an indication of contact erosion. Lastly, Germany Patent Application No. 37 14 802 also describes an electronic switch in which a light guide, the transmission properties of which can be measured from outside by means of suitable auxiliary optical equipment, is associated with at least one of the contact elements. The intention in this context is that contact erosion which has progressed impermissibly leads to a change in optical transmission properties and ultimately to destruction of the light guide. In particular, provision is made that each of the contact elements must be fitted with a light guide of this kind.

Accordingly, it is an object of the present invention to provide a switching device with which detection and indication of a defined remaining service life during operation of the switching device are guaranteed in absolutely reliable fashion for all the contact arrangements together. In particular, implementation is to be economical even for smaller switching devices.

SUMMARY OF THE INVENTION

This object is achieved, according to the present invention, using an electrical signal line which is guided in a U-shape between the contact elements and the associated contact supports or in the contact material itself.

The insulated signal line consists either of doubly guided wires or a U-shaped loop with two insulated supply leads. In this context, the U-shaped loops of a measuring wire can be guided, insulated from one another, preferably in a metal-sheathed tube. Such lines are previously known, for example, as ungrounded sheathed thermocouples, and can to that extent be used according to the present invention for the present purpose.

In the present invention, the contact element can have on its rear-side soldering surface a groove, a blind hole, or other orifices into which the insulated signal line can be inserted. The insulator can consist, in particular, of a glass-fiber sheath or another temperature-resistant insulator.

The present invention provides an arrangement which guarantees optimum functional reliability under all operating conditions. Multipole switching devices in particular can thereby be monitored for erosion in suitable fashion; wear on a contact element usually results in an indication that does not need to be localized to a specific contact element.

DETAILED DESCRIPTION OF THE INVENTION

Figure 1:
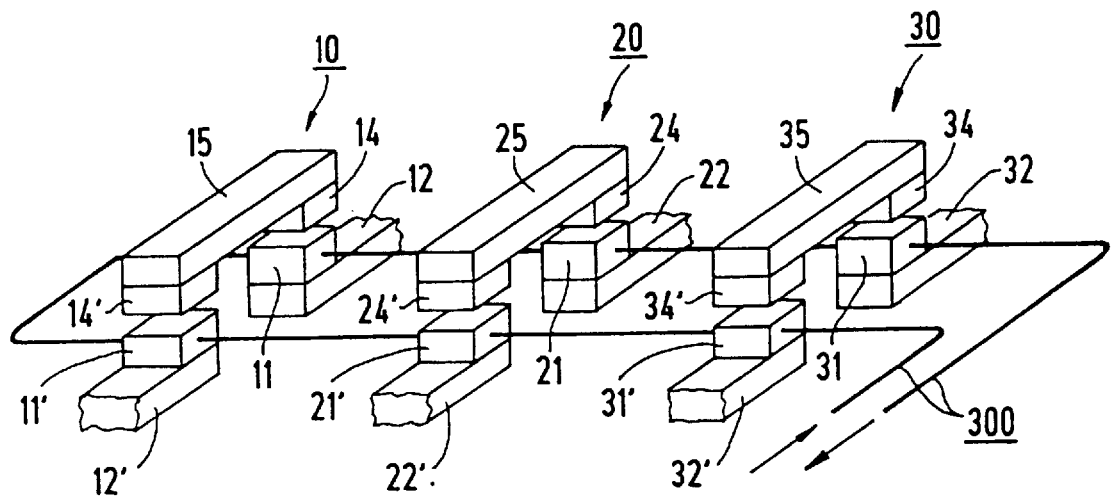
FIG. 1 shows a three-pole grounded contact arrangement with monitoring means arranged in a single circuit.

FIG. 1 shows a contact arrangement for a three-pole contactor in which contact arrangements 10, 20, and 30, each including two fixed contact elements 11, 21, 31 and 11', 21', 31' that are soldered onto contact supports 12, 22, and 32 and 12', 22', and 32', respectively. Countercontacts 14, 24, 34 and 14', 24', 34', which are each soldered onto a movable contact bridge 15, 25, and 35 will not be discussed in detail in this context. In principle, the measuring means described hereinafter could also be installed on the moving contacts.

A single insulated signal line 300 which passes through the individual contacts and forms a closed signal line circuit is present in FIG. 1. Through holes can be present for this purpose in the individual contacts 11, 21, 31 and 11', 21', 31'. It is also possible to guide signal line 300 between the individual contacts and the contact supports. Milled recesses or grooves can optionally be provided in the contacts.

Figure 2:
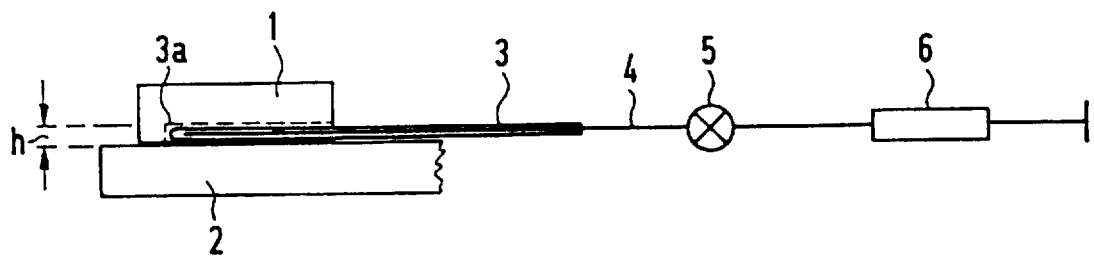
FIG. 2 shows a first embodiment of a monitoring circuit according to the present invention.

In FIG. 2, a contact element 1 that is soldered onto a contact support 2 is equipped with a groove 3a in which an insulated signal line, consisting of an insulator 3 and a metal conductor 4, is located. Conductor 4 is connected, via an indicator 5 and a protective resistor 6, to the neutral conductor or another phase of the switched system.

Insulator 3 in FIG. 2 can consist in particular of a glass-fiber sheath. When an erosion state of contact element 1 is reached such that groove 3a and thus insulator 3 are exposed to the switching arc, they are destroyed and conductor 4 receives the electrical potential of contact element 1. A limited current flow occurs via protective resistor 6 and directly activates indicator 5, for example a light-emitting diode (LED).

Height h of the groove in FIG. 2 thus directly defines the erosion state at which, for example, an "X percent remaining service life" indicator can be activated.

Figure 3:
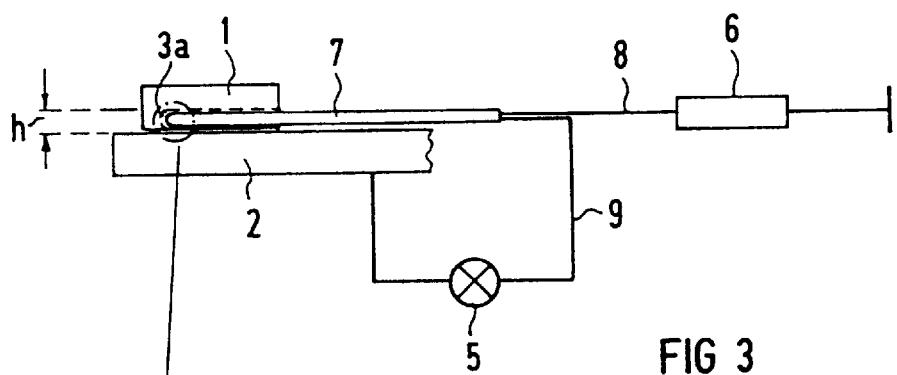
FIG. 3 shows a second embodiment of a monitoring circuit according to the present invention.
Figure 3A:
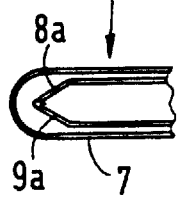

In FIG. 3, a U-shaped loop of an insulated wire is laid into groove 3a: this arrangement can consist of a metal-sheathed tube 7 with two wires 8 and 9 installed therein, insulated from one another and also from the sheath. The latter arrangement is implemented by, for example, an ungrounded sheathed thermocouple. In sheathed thermocouples of this kind, the outside diameter of sheath 7 is typically 1 mm. The enlargement in FIG. 3a shows a plan view, the conductor ends of the U-shaped loops being designated 8a and 9b.

In the example according to FIG. 3, a current 2 flows continuously from the contact bridge through indicator 5, both conductors 8, 9 of the sheathed thermocouple, and the limiting resistor 6, to the neutral conductor or another phase in the switched device. In this case, activation of indicator 5, for example a light-emitting diode (LED), means that the remaining service life has not yet been reached.

Destruction of the sheathed element by erosion extinguishes indicator 5 as soon as conductor 9 is either separated from conductor 8 and/or makes contact with sheath 7.

Figure 4:
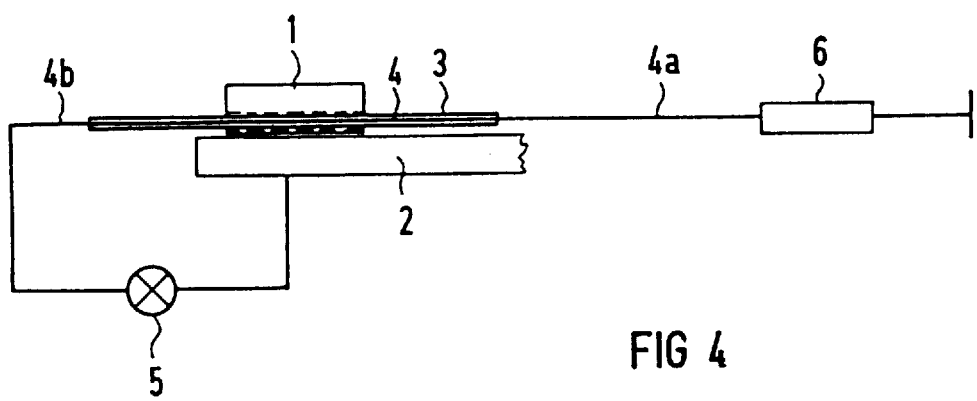
FIG. 4 shows a third embodiment of a monitoring circuit according to the present invention.

FIG. 4 shows a fixed contact bridge 2 with a contact element 1 on the rear side of which a metal conductor 4 extends in an insulator 3 and has connector ends 4a and 4b. As long as insulator 3 is intact, a current flows from contact bridge 2 through indicator 5, metal conductor 4, and the protective resistor to neutral or to another phase. In this case, the fact that the remaining service life has not yet been reached is indicated. As soon as the switching arc destroys insulator 3 and conductor 4, current flow to the indicator is interrupted. This applies both to the case of a simple interruption of conductor 4 and to the case in which conductor 4 additionally makes contact with contact element 1 and thereby short-circuits indicator 5.

An advantage of the exemplified embodiments described is that the cost outlay is comparatively low, and is determined solely by installation of the signal line in the switch contact. By connecting an indicating means to the contact support, for example, it is possible in this context to utilize the potential for indication purposes. In any case, the fact that the remaining service life of the switching device has been reached is detected and indicated.

The arrangements described with reference to the embodiments shown in FIGS. 2–4 can be designed for multi-phase contactors as illustrated in FIG 1. It is particularly advantageous in this context that only a single signal line is necessary.

Figure 5:
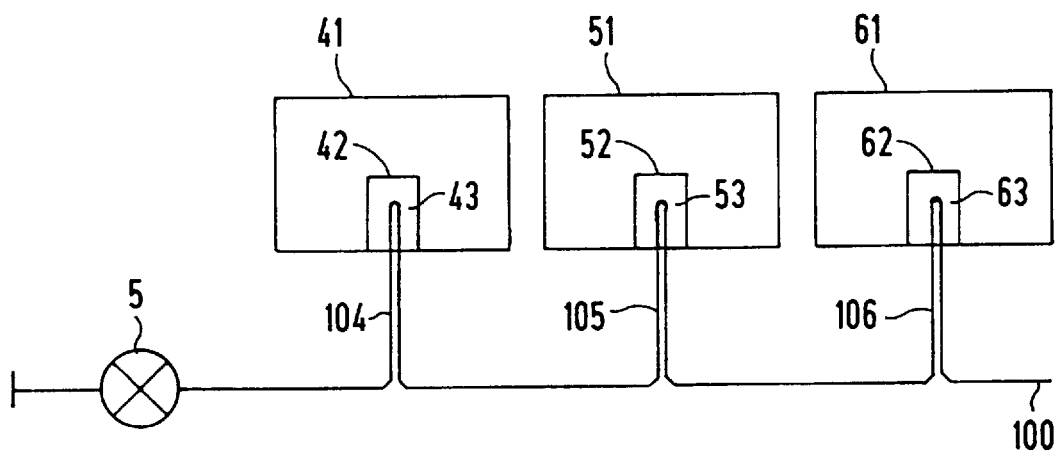
FIG. 5 shows a fourth embodiment of a monitoring circuit according to the present invention.

FIG. 5 shows an arrangement with three contact elements 41, 51, and 61, each of which has on the rear side a blind hole 42, 52, and 62. Signal lines are introduced into blind holes 42, 52, and 62 by means of suitable insulators 43, 53, and 63. As shown in FIG. 5, for example, a single measuring wire 100 can be guided from indicator device 5 in such a way that the respective branch 104, 105, and 106 for contact elements 41, 51, and 61 is guided in doubled or U-shaped fashion, corresponding to the sheathed thermocouple of FIG. 3a.

The double wire configuration guarantees the reliability of the indicator even if destruction is only partial. In addition, parallel monitoring is possible. As a result, many contacts can be monitored simultaneously and economically by means of a single arrangement.

What is claimed is:

1. A switching device, comprising:

a housing;

a contact element mounted in the housing on a contact support; and an electrically insulated signal line for monitoring contact erosion, wherein, when the electrically insulated signal line is damaged, an external signal is generated indicating that a service life of the contact element has ended, and wherein the electrically insulated signal line is guided in a U-shape between the contact element and the associated contact support.

2. The switching device according to claim 1, wherein, in a multiple phase system with a neutral conductor, the electrically insulated signal line is connected to one of a neutral conductor and to another phase via an indicating device and via an associated protective resistor.

3. The switching device according to claim 1, wherein the electrically insulated signal line is extended in a U-shape over an entire rear side of the contacting element, wherein a first end of the electrically insulated signal line is coupled to one of a neutral conductor and to another phase via a resistor, and wherein a second end of the electrically insulated signal line is connected to the contact support via an indicating device.

4. The switching device according to claim 1, wherein the associated contact support is a fixed contact support that is utilized for indicating purposes.

5. The switching device according to claim 1, wherein the contact element has a rear-side soldering surface with a groove on the rear-side soldering surface, and wherein the electrically insulated signal line extends in a U-shape.

6. The switching device according to claim 1, wherein the electrically insulated signal line includes and insulator being composed of one of a glass-fiber sheath and another temperature-resistant insulator.

7. The switching device according to claim 5, wherein the groove has a height for indicating a remaining amount of a freely selectable remaining service life of the plurality of contact elements.

8. The switching device according to claim 5, wherein the switching device is one of a contactor and a circuit breaker.

9. The switching device according to claim 1, wherein the electrically insulated signal line that is guided in a U-shape includes a U-shape loop and two supply leads insulated from one another.

10. The switching device according to claim 9, wherein the U-shaped loop is guided in an insulated manner in a metal-sheathed tube.

11. The switching device according to claim 10, wherein the U-shaped loop in the metal-sheathed tube is implemented as an ungrounded sheathed thermocouple.

12. The switching device according to claim 11, wherein a first lead of the two supply leads coupled to the U-shaped loop is connected to one of the neutral conductor and a different phase via a protective resistor, and wherein a second lead of the two supply leads is connected to the associated contact support via an indicating device.

* * * * *